United States Patent
Srinivasan et al.

(10) Patent No.: US 6,237,061 B1
(45) Date of Patent: May 22, 2001

(54) METHOD FOR LONGEST PREFIX MATCHING IN A CONTENT ADDRESSABLE MEMORY

(75) Inventors: Varadarajan Srinivasan, Los Altos Hills; Bindiganavale S. Nataraj, Cupertino; Sandeep Khanna, Santa Clara, all of CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/225,918

(22) Filed: Jan. 5, 1999

(51) Int. Cl.[7] .................................................. G06F 12/04
(52) U.S. Cl. ........................................ 711/108; 711/212
(58) Field of Search ............................... 365/49; 711/108, 711/164, 212; 707/3, 6, 7; 370/389, 392, 471, 475; 709/220, 226, 238

(56) References Cited

U.S. PATENT DOCUMENTS

| | | | |
|---|---|---|---|
| 4,670,858 | 6/1987 | Almy | 365/49 |
| 4,928,260 | 5/1990 | Chuang et al. | 365/49 |
| 5,010,516 | 4/1991 | Oates | 365/49 |
| 5,053,991 | 10/1991 | Burrows | 365/49 |
| 5,239,642 | 8/1993 | Gutierrez et al. | 395/425 |
| 5,319,763 | 6/1994 | Ho et al. | 395/425 |
| 5,386,413 * | 1/1995 | McAuley et al. | 370/54 |
| 5,422,838 | 6/1995 | Lin | 365/49 |
| 5,475,825 | 12/1995 | Yonezawa et al. | 395/401 |
| 5,649,149 | 7/1997 | Stormon et al. | 395/435 |
| 5,745,488 | 4/1998 | Thompson et al. | 370/395 |
| 5,841,874 | 11/1998 | Kempke et al. | 380/50 |
| 5,860,085 | 1/1999 | Stormon et al. | 711/108 |
| 5,893,931 | 4/1999 | Peng et al. | 711/206 |
| 5,920,886 | 7/1999 | Feldmeier | 711/108 |
| 6,000,008 | 12/1999 | Simcoe | 711/108 |
| 6,001,179 | 1/2000 | Varghese et al. | 370/392 |
| 6,006,306 | 12/1999 | Haywood et al. | 711/108 |
| 6,065,064 | 5/2000 | Satoh et al. | 709/249 |
| 6,081,440 | 6/2000 | Washburn et al. | 365/49 |

FOREIGN PATENT DOCUMENTS

WO 99/23664 * 5/1999 (WO).

OTHER PUBLICATIONS

IBM Corp., "Memory Organization scheme for the Implementation of Routing Tables in High Performance IP Routers," 1993, IBM Technical Disclosure Bulletin, 151–153.*
"A 50–Mpps Longest Prefix Match Search Engine IC for Multi–gigabit IP Forwarding", Kobayashi et al, Technical Report of IEICE, 1998, pp. 7–12, translation abstract only.
Application Note AN–N22, Music Semiconductors, Oct. 1998, Rev. 0.1a.
"Routing Lookups in Hardware at Memory Access Speeds", Gupta et al, Processor Infocom, Apr. 1998.

* cited by examiner

*Primary Examiner*—Reginald G. Bragdon
*Assistant Examiner*—Denise Tran
(74) *Attorney, Agent, or Firm*—William L. Paradice, III

(57) ABSTRACT

A ternary content addressable memory is employed to perform a longest prefix match search. Each CAM cell within the ternary CAM has an associated mask cell so that the CAM cells may be individually masked so as to effectively store either a logic 0, a logic 1, or a don't care for compare operations. For example, Classless Inter-Domain Routing (CIDR) addresses are pre-sorted and loaded into the ternary CAM such that the CAM entry having the longest prefix is located at the lowest numerical address or index of the ternary CAM, and the CAM entry with the shortest prefix is located at the highest numerical address or index. The prefix portions of the CIDR addresses are used to set the mask cells associated with each CAM entry such that during compare operations, only the unmasked prefix portion of each CAM entry is compared to an incoming destination address stored as the CAM search key. Since each CAM entry is masked according to an associated prefix value, the ternary CAM requires only one search operation to locate the CAM entry having the longest matching prefix.

7 Claims, 6 Drawing Sheets

| CAM index | IPv4/Z | CAM cell/Mask cell | CAM Entries | | | | |
|---|---|---|---|---|---|---|---|
| 7 | 209.120.0.0/13 | CAM WORD<br>MASK WORD | 1101 0001<br>0000 0000 | 0111 1000<br>0000 0111 | 0000 0000<br>1111 1111 | 0000 0000<br>1111 1111 | ← 202<br>← 204 |
| 6 | 209.120.0.0/14 | CAM WORD<br>MASK WORD | 1101 0001<br>0000 0000 | 0111 1000<br>0000 0011 | 0000 0000<br>1111 1111 | 0000 0000<br>1111 1111 | |
| 5 | 209.120.0.0/15 | CAM WORD<br>MASK WORD | 1101 0001<br>0000 0000 | 0111 1000<br>0000 0001 | 0000 0000<br>1111 1111 | 0000 0000<br>1111 1111 | |
| 4 | 209.131.0.0/16 | CAM WORD<br>MASK WORD | 1101 0001<br>0000 0000 | 1000 0011<br>0000 0000 | 0000 0000<br>1111 1111 | 0000 0000<br>1111 1111 | |
| 3 | 209.131.168.0/21 | CAM WORD<br>MASK WORD | 1101 0001<br>0000 0000 | 1000 0011<br>0000 0000 | 1010 1000<br>0000 0111 | 0000 0000<br>1111 1111 | |
| 2 | 209.131.168.0/23 | CAM WORD<br>MASK WORD | 1101 0001<br>0000 0000 | 1000 0011<br>0000 0000 | 1010 1000<br>0000 0001 | 0000 0000<br>1111 1111 | |
| 1 | 209.131.168.0/24 | CAM WORD<br>MASK WORD | 1101 0001<br>0000 0000 | 1000 0011<br>0000 0000 | 1010 1000<br>0000 0000 | 0000 0000<br>1111 1111 | |
| 0 | 209.131.162.96/27 | CAM WORD<br>MASK WORD | 1101 0001<br>0000 0000 | 1000 0011<br>0000 0000 | 1010 0010<br>0000 0000 | 0110 0000<br>0001 1111 | ← 202<br>← 204 |

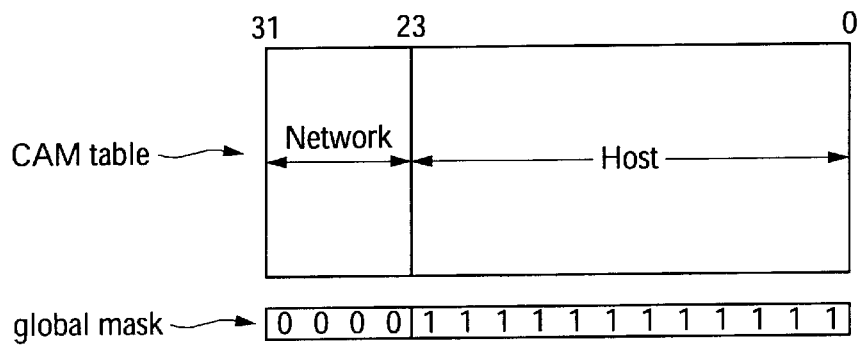
FIG. 1
(PRIOR ART)
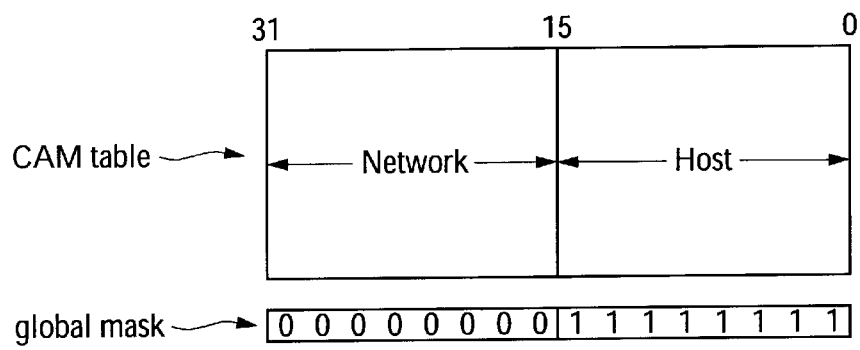
FIG. 2A
(PRIOR ART)
FIG. 2B
(PRIOR ART)
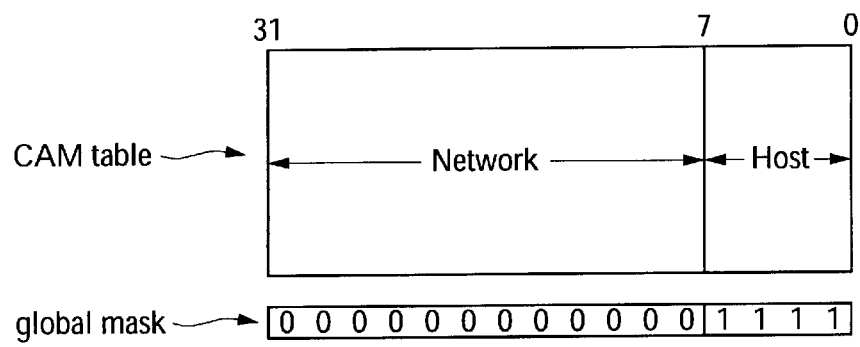
FIG. 2C
(PRIOR ART)

| CAM index | IPv4/Z | CAM cell/Mask cell | CAM Entries | | | |
|---|---|---|---|---|---|---|
| 7 | 209.120.0.0/13 | CAM WORD<br>MASK WORD | 1101 0001<br>0000 0000 | 0111 1000<br>0000 0111 | 0000 0000<br>1111 1111 | 0000 0000<br>1111 1111 |
| 6 | 209.120.0.0/14 | CAM WORD<br>MASK WORD | 1101 0001<br>0000 0000 | 0111 1000<br>0000 0011 | 0000 0000<br>1111 1111 | 0000 0000<br>1111 1111 |
| 5 | 209.120.0.0/15 | CAM WORD<br>MASK WORD | 1101 0001<br>0000 0000 | 0111 1000<br>0000 0001 | 0000 0000<br>1111 1111 | 0000 0000<br>1111 1111 |
| 4 | 209.131.0.0/16 | CAM WORD<br>MASK WORD | 1101 0001<br>0000 0000 | 1000 0011<br>0000 0000 | 0000 0000<br>1111 1111 | 0000 0000<br>1111 1111 |
| 3 | 209.131.168.0/21 | CAM WORD<br>MASK WORD | 1101 0001<br>0000 0000 | 1000 0011<br>0000 0000 | 1010 1000<br>0000 0111 | 0000 0000<br>1111 1111 |
| 2 | 209.131.168.0/23 | CAM WORD<br>MASK WORD | 1101 0001<br>0000 0000 | 1000 0011<br>0000 0000 | 1010 1000<br>0000 0001 | 0000 0000<br>1111 1111 |
| 1 | 209.131.168.0/24 | CAM WORD<br>MASK WORD | 1101 0001<br>0000 0000 | 1000 0011<br>0000 0000 | 1010 1000<br>0000 0000 | 0000 0000<br>1111 1111 |
| 0 | 209.131.162.96/27 | CAM WORD<br>MASK WORD | 1101 0001<br>0000 0000 | 1000 0011<br>0000 0000 | 1010 0010<br>0000 0000 | 0110 0000<br>0001 1111 |

FIG. 6

| | Dotted Decimal | 32-bit Search Key | | | | Result |
|---|---|---|---|---|---|---|
| ex.1 | 209.131.169.112 | 1101 0001 | 1000 0011 | 1010 1001 | 0111 0000 | Longest Prefix Match at 2 |
| ex.2 | 209.131.162.107 | 1101 0001 | 1000 0011 | 1010 0010 | 0110 1011 | Longest Prefix Match at 0 |
| ex.3 | 209.131.168.134 | 1101 0001 | 1000 0011 | 1010 1000 | 1000 0110 | Longest Prefix Match at 1 |
| ex.4 | 209.122.168.145 | 1101 0001 | 0111 1010 | 1010 1000 | 1001 0001 | Longest Prefix Match at 6 |

FIG. 7

METHOD FOR LONGEST PREFIX MATCHING IN A CONTENT ADDRESSABLE MEMORY

BACKGROUND

1. Field of Invention

This invention relates generally to Internet Protocol addressing and specifically to using a ternary CAM to implement Classless Inter-Domain Routing functions.

2. Description of Related Art

Packets of data are relayed across the Internet according to an Internet Protocol (IP) addressing scheme. One commonly used IP addressing scheme is known as IPv4. An IPv4 address is a 32-bit binary address represented as a dotted decimal of the form M.N.O.P, where M, N, O and P are decimal values ranging from 0–255. Each 32-bit IPv4 address includes a Network ID field and a Host ID field, where the network ID field contains the address of the destination network, e.g., an Internet Service Provider (ISP) such as, for instance, America Online, and the host ID field contains the address of the destination host, e.g., a corporate network such as, for instance, IBM Corporation. When sending a data packet across the Internet from a source to a destination, the destination address is compared with address routing entries in a content addressable memory (CAM) associated with the source network to determine, for example, the best path over which to send the data packet to the destination network. Here, the network ID field bits of the incoming destination address are compared with corresponding bits of the CAM routing table entries and, if there is a match, the packet is routed to the destination network according to routing data associated with the matching CAM entry. During this CAM search, the host ID field bits of all routing entries in the CAM are masked using a well known global masking function. Typically, after the data packet is received at the destination network, the host ID field bits of the destination address are then compared with the corresponding host ID field bits of CAM routing entries associated with the destination network to determine the best path over which to route the packet to its destination host.

IPv4 addresses are segmented into Classes depending upon the number of bits in the network ID and host ID fields. Referring to FIG. 1, Class C IPv4 addresses have an 8-bit network ID field and a 24-bit host ID field, Class B IPv4 addresses have a 16-bit network ID field and a 16-bit host ID field, and Class A IPv4 addresses have a 24-bit network ID field and an 8-bit host ID field. Thus, if a particular company requires less than $2^8$=256 addresses, Class C IPv4 addressing provides the most efficient addressing. Similarly, if a company requires between $2^8$ and $2^{16}$ host addresses, Class B IPv4 addressing is used and, if a company requires more than $2^{16}$ host addresses, Class A IPv4 addressing is used. For Class C addressing, the global mask associated with the CAMs is set to mask the right-most 24-bits of the CAM routing table entries corresponding to the host ID field, as shown in FIG. 2A. For Class B addressing, the global mask associated with the CAMs is set to mask the right-most 16-bits of the CAM routing table entries corresponding to the host ID field, as shown in FIG. 2B. For Class A addressing, the global mask associated with the CAMs is set to mask the right-most 8-bits of the CAM routing table entries corresponding to the host ID field, as shown in FIG. 2C.

The rapid growth of the Internet has resulted in an increase in the number of IPv4 addresses which, in turn, has necessitated a more efficient use of IP addressing. For instance, if a company requires 300 host addresses, the company would use a Class B IPv4 address. However, since a Class B IPv4 address includes a 16-bit host address for up to $2^{16}$=64 k possible host addresses, most of the host addresses are not used, thereby resulting in an inefficient use of IP addresses. In response thereto, a classless IP addressing scheme was developed that allows for a floating boundary between the network ID field and the host ID field. This classless IP addressing scheme, commonly known as Classless Inter-Domain Routing (CIDR), is written as a standard 32-bit IPv4 address followed by a prefix Z, i.e., IPv4/Z, where the prefix Z indicates the number of bits in the network ID field and, thus, indicates the prefix length of the CIDR address. For instance, a CIDR address of 168.69.48.112/12 has a 12-bit network ID field and a 20-bit host ID field.

FIG. 3 shows a CAM routing table having five CIDR address entries each having a different number of bits in its network ID field, where the prefix/Z following each address indicates the number of bits in the network ID field. The CAM entries are ordered such that the CIDR address with the longest prefix, i.e., the greatest number of bits in its network ID field, are located in the lowest numerical address of the CAM, while the CIDR address with the shortest prefix, i.e., the fewest number of bits in its network ID field, are located in the highest numerical address of the CAM. An incoming address of 168.69.43.100 is encoded into the Search Key associated with the CAM. Since only the network ID field bits of each CAM entry (e.g., CDIR address) are compared with the corresponding bits of the search key, and each CAM entry has a different number of bits in its network ID field, each CAM entry may require a different number of its bits to be masked during compare operations in order to determine which CAM entry has the most number of unmasked bits which match corresponding bits of the search key, i.e., which CAM entry has the longest matching prefix (e.g., network ID).

Here, the CAM global mask is initially set to mask none of the CAM entry bits, and then the search key is compared with all CAM entries to determine if there is a match. If there is a match, the index of the matching CAM entry is read from the CAM, as well as any associated routing data, and the data packet is routed accordingly. If there are multiple matches, the matching CAM entry with the lowest numerical CAM address, and thus by definition having the longest matching prefix, is provided. If there is not a match, the CAM global mask is changed so as to mask the least significant bit, i.e., the right-most bit, of all CAM entries, and the search key is again compared with the unmasked bits of all CAM entries. If there is a match, the matching CAM index is output as described above. If there is not a match, the global mask is changed so as to mask the 2 least significant bits of all CAM, and the resulting unmasked bits of all CAM entries are again compared with the corresponding bits of the search key. This process is repeated until either a match is found or a maximum number of mask bits has been exceeded, in which case the routing information with the incoming destination address is not contained in the CAM.

For example, referring again to the example illustrated in FIG. 3, the global mask is initially set to have a logic 0 value in each of its left-most 24 bits and a logic 1 in each of its right-most 8 bits, where a logic 1 indicates that corresponding bits of the search key and CAM entries are not compared. Thus, the corresponding left-most 24 bits of the search key are compared to the left-most 24-bits of each CAM entry. Here, since the result is a no match condition, the global mask is changed so as to mask the right-most 12 bits of the CAM entries, whereby the corresponding left-most 20 bits of the search key are compared with corresponding bits of each CAM entry in a subsequent compare operation. Since the result is a no match condition, the global mask is again changed so as to mask the right-most 16 bits of the CAM entries. Here, the compare operation yields a match condition and reads the CAM entry (and any associated information) which corresponds to the CIDR address 168.69.0.0/16.

Note that in the example shown in FIG. 3, the global mask is described as being initially set to mask the 8 right-most bits of all CAM entries, and then is incremented by 4 bits on each global mask iteration. This abbreviated global mask iteration, as opposed to mask iterations which initially have no masked bits and are incremented one bit per iteration, is possible only where it is known that all pertinent CAM entries are CIDR address having set prefix lengths. Thus, since in the example of FIG. 3 the prefix lengths are 8, 12, 16, 20, and 24, the global mask may be initially set to mask the 8 least significant bits and be incremented four bits on each global mask iteration.

Although CIDR addressing allows for more efficient use of IP addresses, network routers typically perform multiple searches for each incoming destination address to locate the CAM entry having the longest matching prefix, as just demonstrated. Performing multiple CAM searches for each incoming destination address requires considerable time and, thus, significantly slows routing speeds. It would therefore be desirable to implement CIDR addressing without requiring multiple CAM searches.

SUMMARY

A system is disclosed which overcomes above-mentioned problems in the art. In accordance with the present invention, a novel ternary content addressable memory is employed to perform a longest prefix match search. Each CAM cell within the ternary CAM has an associated mask cell so that the CAM cells may be individually masked so as to effectively store either a logic 0, a logic 1, or a don't care for compare operations. Classless Inter-Domain Routing (CIDR) addresses are pre-sorted and loaded into the ternary CAM such that the CAM entry having the longest prefix is located at the lowest numerical address or index of the ternary CAM, and the CAM entry with the shortest prefix is located at the highest numerical address or index. The prefix portions of the CIDR addresses are used to set the mask cells associated with each CAM entry such that during compare operations, only the unmasked prefix portion of each CAM entry, which may correspond to a network ID field, is compared to an incoming destination address stored as the CAM search key. Since each CAM entry is masked according to an associated prefix value, the ternary CAM requires only one search operation to locate the CAM entry having the longest matching prefix. Accordingly, the present invention allows a network router to implement a CIDR addressing scheme without compromising speed.

BRIEF DESCRIPTION OF THE DRAWINGS

FIG. 1 illustrates network and host ID field segmenting of the IPv4 Class-based addressing scheme;

FIG. 2A illustrates IPv4 Class C addresses stored in a CAM routing table;

FIG. 2B illustrates IPv4 Class B addresses stored in a CAM routing table;

FIG. 2C illustrates IPv4 Class A addresses stored in a CAM routing table;

FIG. 4;

FIG. 6 illustrates CIDR addresses stored in a ternary CAM routing table in accordance with the present invention; and FIG. 7 illustrates the results of four compare operations using the ternary CAM routing table of FIG. 6.

Like reference numerals refer to corresponding parts throughout the drawing figures.

DETAILED DESCRIPTION

Embodiments of the present invention are discussed below in the context of a ternary CAM array 200 for simplicity only. It is to be understood that embodiments of the present invention are equally applicable for use with other suitable ternary CAM arrays. Accordingly, the present invention is not to be construed as limited to specific examples described herein but rather includes within its scope all embodiments defined by the appended claims.

Figure 3:
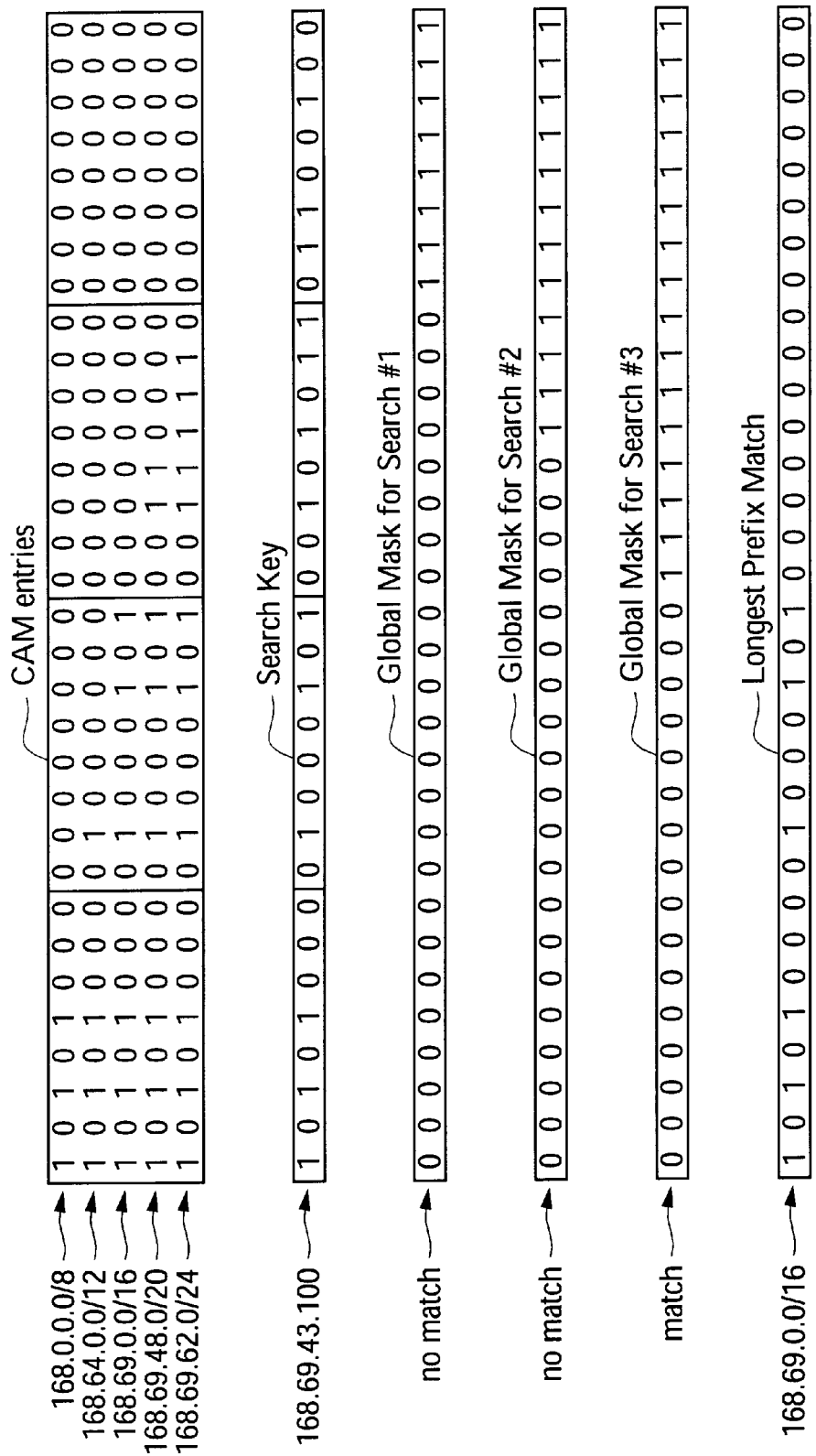
FIG. 3 illustrates CIDR addresses stored in a CAM routing table, a search key associated with compare operations of the CAM routing table, and global masks for successive compare operations of the CAM routing table.
Figure 4:
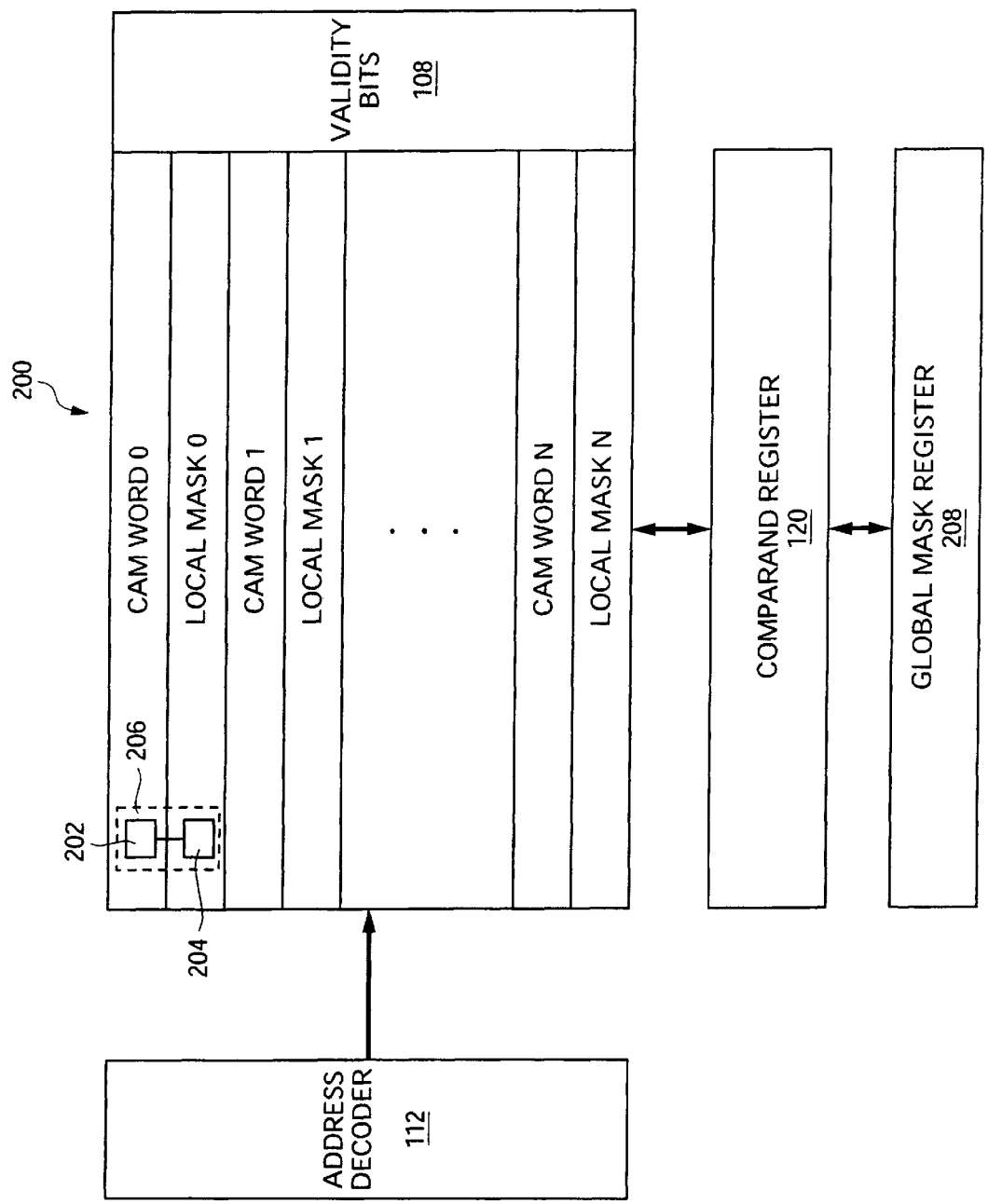
FIG. 4 is a block diagram of a ternary CAM array used in implementing the present invention.

FIG. 4 shows a ternary CAM device 200 according to one embodiment of the present invention. The ternary CAM 200 has a plurality of CAM words and a plurality of corresponding local mask words. Each CAM word includes a number of CAM cells 202 for storing information such, as for instance, a CIDR address, and each local mask word includes a corresponding number of mask cells 204 for storing masking data for the associated CAM word. If a particular mask cell 204 stores a logic 0, then the address bit stored in the corresponding CAM cell is compared to a corresponding bit of a search key during compare operations. Conversely, if the mask cell 204 stores a logic 1, then the address bit stored in the corresponding CAM cell is not compared to the search key during compare operations. In this manner, each CAM cell 202 and mask cell 204 pair, hereinafter denoted as ternary cell 206, effectively stores three states of information, a logic 0 state, a logic 1 state, and a don't care state. As a result, each CAM word in the ternary CAM 200 may be individually masked on a bit-by-bit basis.

Local mask information can be written to each of the local mask words directly from comparand register 120, a global mask register 208, or from other storage locations (not shown for simplicity) in CAM device 200. The local mask locations may be selected for writing by address decoder 112 and the local mask locations may be sequentially or randomly selected to receive local mask data. The local mask data may also be read via sense amplifiers (not shown for simplicity) and may be provided to comparand register 120, a global mask register, or any other storage element in CAM device 200.

Typically, the local mask cells are volatile mask cells that need to be updated after power up of CAM device 200. The local mask cells may also be updated when the corresponding CAM cells are updated, or at any other time. The local mask cells may be other types of memory cells including nonvolatile memory cells. Alternatively and/or additionally, the local mask cells may be resettable to a predetermined state, for example, after power-up or by other means.

Figure 5:
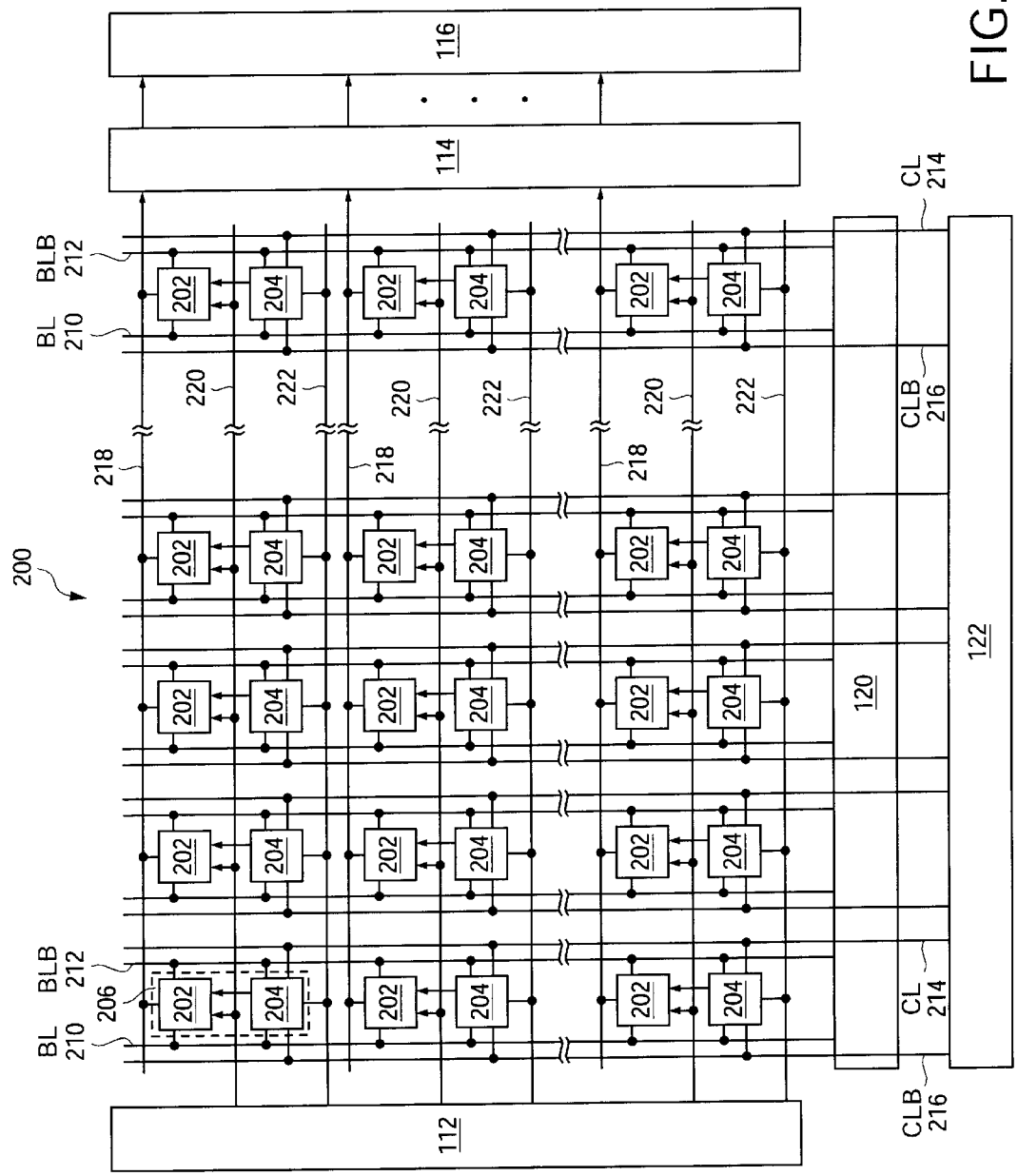
FIG. 5 is one embodiment of the ternary CAM of FIG. 4.

FIG. 5 shows one embodiment of ternary CAM array 200 including CAM words that each include a row of any number of the CAM cells 202, and local mask words that each include a row of any number of mask cells 204. Validity bits may also be included in additional rows and columns of CAM cells 202. Each CAM cell 202 is coupled to match line 218, word line 220, bit line BL 210, and the logical complement of bit line BLB 212. Each local mask cell 204 is coupled to a corresponding CAM cell 202, BL 210, BLB 212, comparand line CL 214, the logical complement of the comparand line CLB 216, and a mask word line 222. The comparand lines provide comparand data to the CAM cells 202 for comparison with the data stored in the CAM cells. Although CL 214 and CLB 216 are shown as providing data to local mask cells 204, in alternative embodiments, CAM cells 202 may additionally or alternatively receive comparand data from CL 214 and CLB 216. Additionally, while ternary CAM 200 shows columns of CAM cells 202 and mask cells 204 coupled to common bit lines, in an alternative embodiment, mask cells 204 may be coupled to separate mask bit lines. Additionally and/or alternatively, word lines 220 and 222 may be the same word line.

Each word line 220 is driven by address decoder 112 to select one or more of CAM cells 202 for writing or reading. Similarly, each mask word line 222 is driven by address decoder 112 to select one or more of local mask cells 204 for writing or reading. Address decoder 112 may drive either the word lines 220 or the mask word lines 222 in response to the appropriate instruction decoded by an instruction decoder (not shown for simplicity). Each CAM cell 202/local mask cell 204 pair may be considered a mask-per-bit 206 CAM cell in which the local mask cell 204 is used to store mask data for its corresponding CAM cell 202. For alternative embodiments, local mask cell 204 may be used to store masking data corresponding to more than one CAM cell 202.

In order to implement CIDR addressing using the ternary CAM 200, incoming CIDR addresses (IPv4/Z) are pre-sorted and loaded into respective CAM words of the CAM array 200 such that the address entries having the longest prefixes are placed in the lowest numerical address or index of the CAM 200. Thus, referring to the example of FIG. 6, where 8 pre-sorted CIDR addresses are shown loaded into a suitable ternary CAM such as, for instance, the ternary CAM 200 of FIG. 4, the CIDR address 209.131.162.96/27 has the longest prefix, i.e., 27 bits, and is thus loaded into the lowest numerical CAM address at word 0. The mask cells 204 of the associated local mask word at index 0 are set to have a logic 0 in each of the 27 left-most bits and a logic 1 in each of the 5 right-most bits, as shown in FIG. 6. In this manner, the 5 least significant bits of the CAM word at index 0 are masked so that only the 27-bit prefix of CIDR addresses stored at CAM word 0 is compared to a comparand word such as, for instance, an incoming address search key. The CAM array 200 is then filled from the bottom up with the CIDR address having the next longest prefix. Thus, the address with the shortest prefix, e.g., 209.120.0.0/13, is loaded at the highest CAM index, e.g., CAM index 7.

An incoming address is provided to the comparand register 120 as the comparand and thereafter provided to respective CL 214 and CLB 216 line pairs as described above. The comparand (destination address) is then compared to each of the CIDR addresses stored in the CAM words of the CAM array 200 according to the corresponding prefix masks stored in respective mask words of the CAM array 200. As explained above, if a particular mask cell 204 is set to logic 1 (masked), the corresponding CAM cell 202 is prevented from pulling its associated match line 218 to logic low and, thus, is forced to "match" the corresponding comparand bit and, conversely, if a particular mask cell 204 is set to logic 0 (unmasked), the corresponding CAM cell 202 data is compared with the corresponding comparand bit. If there is not a match, the match flag signal MF indicates a "no match" condition, no data is output, and the search operation is complete. If there is a match, a suitable match flag signal is asserted, and the index of the matching CAM word, as well as any associated routing data stored in the CAM array 200 or in an external memory such as, for instance, an SRAM, is provided as output. If there are multiple matches, a suitable multiple match flag signal is asserted and, in response thereto, an associated priority encoder (not shown for simplicity) outputs the highest priority location, i.e., the CAM word having the lowest index which, as explained above, is by definition the longest prefix match. Note that in other embodiments of the present invention, the mask bit scheme may be inverted such that a mask bit equal to logic 0 masks a corresponding bit of the CAM word and a mask bit equal to logic 1 allows for comparison with the corresponding search key bit.

FIG. 7 illustrates the results of four destination address searches using the CAM words shown in FIG. 7. In the first example, the IP address 209.131.169.112 is stored in the comparand register 120 as the corresponding 32-bit search key, and thereafter compared to the 32-bit CAM words 0–7 shown in FIG. 9. Here, the CAM word at index 2 provides the longest prefix match. The results shown in examples 2–4 are obtained in a similar manner.

Present embodiments allow CIDR addresses having different prefix lengths and stored in a single routing table to be compared with an incoming destination address in a single search operation. This is in marked contrast to prior art techniques for implementing CIDR addressing which not only require multiple search operations but also require the global mask to be changed between such search operations. Accordingly, present embodiments advantageously allow the CIDR addressing scheme to be implemented without compromising speed or performance. As a result, present embodiments are particularly useful for maximizing IP addressing efficiency while maintaining routing speed.

In other embodiments, the above-described CIDR address implementation is combined with a conventional binary CAM to provide a hierarchical compare function with CIDR addresses. For example, a binary CAM may be added to the ternary CAM 200 of FIG. 4 to provide additional bits for each CAM word. Here, only if the binary CAM word associated with a particular CAM word matches corresponding additional bits in the search key or comparand will the compare operation proceed with the CIDR address portion in the CAM word being compared with the search key.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A method of determining which of a plurality of CIDR addresses stored in a ternary content addressable memory (CAM) has a longest matching prefix with a comparand of said ternary CAM, each of said CIDR addresses having first and second address fields of varying lengths and having a prefix value indicative of a number of bits in said first address field, said ternary CAM having a plurality of CAM words and a corresponding plurality of mask words, said method comprising the steps of:

loading said plurality of CIDR addresses into respective ones of said plurality of CAM words in a predetermined order such that increasing numerical CAM word addresses correspond to CIDR addresses having decreasing prefix values;

for each CIDR address loaded in the previous step, setting bit values of said corresponding mask word according to said prefix of said CIDR address such that bits of said second address field of each CIDR address are individually masked by said corresponding mask word; and comparing said comparand to said respective first address fields of said plurality of CIDR addresses in a single compare operation.

2. The method of claim 1, wherein said first address field corresponds to a network ID.

3. The method of claim 2, wherein said second address field corresponds to a host ID.

4. The method of claim 1, wherein said CIDR address is a 32-bit binary address.

5. The method of claim 1, wherein said CIDR address is of the form IPv4/Z, where IPv4 comprises said first and second address fields and Z comprises said prefix.

6. The method of claim 1, wherein a mask bit value of logic 1 masks a corresponding bit of said CIDR address.

7. The method of claim 1, wherein a mask bit value of logic 0 masks a corresponding bit of said CIDR address.

* * * * *